United States Patent [19]

Arima et al.

[11] Patent Number: 5,100,818
[45] Date of Patent: Mar. 31, 1992

[54] NON-VOLATILE SEMICONDUCTOR MEMORY DEVICE AND METHOD OF MANUFACTURING THE SAME

[75] Inventors: Hideaki Arima; Natsuo Ajika, both of Hyogo, Japan

[73] Assignee: Mitsubishi Denki Kabushiki Kaisha, Tokyo, Japan

[21] Appl. No.: 637,423

[22] Filed: Jan. 4, 1991

Related U.S. Application Data

[62] Division of Ser. No. 339,546, Apr. 17, 1989, Pat. No. 4,989,054.

[30] Foreign Application Priority Data

Aug. 26, 1988 [JP] Japan .................................. 63-213202

[51] Int. Cl.$^5$ .............................................. H01C 21/28
[52] U.S. Cl. .......................................... 437/43; 437/50
[58] Field of Search ................................... 437/43, 50

[56] References Cited

U.S. PATENT DOCUMENTS

| | | | |
|---|---|---|---|
| 4,417,264 | 11/1983 | Angle | 357/23 |
| 4,455,742 | 6/1984 | Williams et al. | 357/23.5 |
| 4,513,397 | 4/1985 | Ipri et al. | 357/23.5 |
| 4,907,198 | 3/1990 | Arima | 357/23.5 |
| 4,988,635 | 1/1991 | Ajika et al. | 437/43 |
| 5,013,674 | 5/1991 | Bergemont | 437/43 |
| 5,049,516 | 9/1991 | Arima | 437/43 |

FOREIGN PATENT DOCUMENTS

| | | | |
|---|---|---|---|
| 57-80779 | 5/1982 | Japan . | |
| 57-91561 | 6/1982 | Japan . | |
| 62-88369 | 4/1987 | Japan | 437/43 |
| 63-142869 | 6/1988 | Japan | 437/43 |
| 272637 | 3/1990 | Japan | 437/32 |

OTHER PUBLICATIONS

J. Yeargain and C. Kuo "A High Density Floating EEPROM Cell", IEDM (1981), pp. 24–27.
Z. Weinberg "On Tunneling in Metal-Oxide Silicon Structures", Journal of Applied Physics 53(7), Jul. 1982, pp. 5052–5056.

Primary Examiner—Olik Chaudhuri
Assistant Examiner—G. Fourson
Attorney, Agent, or Firm—Lowe, Price, LeBlanc & Becker

[57] ABSTRACT

First, second, third and fourth impurity regions are formed on a major surface of a semiconductor substrate with prescribed spaces, to define first, second and third channel regions in portions held between the same. A select gate is formed on the first channel region through an insulating film, to define a transistor with the first and second impurity regions. A part of a control gate is formed on the third channel region through an insulating film, to define a transistor with the third and fourth impurity regions. A floating gate is formed on the second channel region and parts of the select gate and the control gate through an insulating film, to define a transistor with the second and third impurity regions. Both end portions of the floating gate are inwardly separated from upper positions of respective outer ends of parts of the select gate and the control gate, in order to improve an effect of shielding the floating gate against a fourth impurity region. Another part of the control gate is formed on the floating gate through an insulating film. The first impurity region is connected to a bit line and the fourth impurity region is connected to a source region respectively.

4 Claims, 10 Drawing Sheets

NON-VOLATILE SEMICONDUCTOR MEMORY DEVICE AND METHOD OF MANUFACTURING THE SAME

This application is a division of application Ser. No. 339,546, filed Apr. 17, 1989, now U.S. Pat. No. 4,989,054.

CROSS-REFERENCE TO RELATED, COPENDING APPLICATION

Related, copending application of particular interest to the instant application is U.S. Ser. No. 266,058, entitled "Semiconductor Memory Device", filed Nov. 2, 1988, now U.S. Pat. No. 4,907,198, and assigned to the same assignee of the instant application.

BACKGROUND OF THE INVENTION

1. Field of the Invention

The present invention relates generally to a non-volatile memory device, and more particularly, to improvement of EEPROM type non-volatile semiconductor memory devices having a self-aligned structure. The invention relates to a manufacturing method therefor.

2. Description of the Background Art

Figure 8:
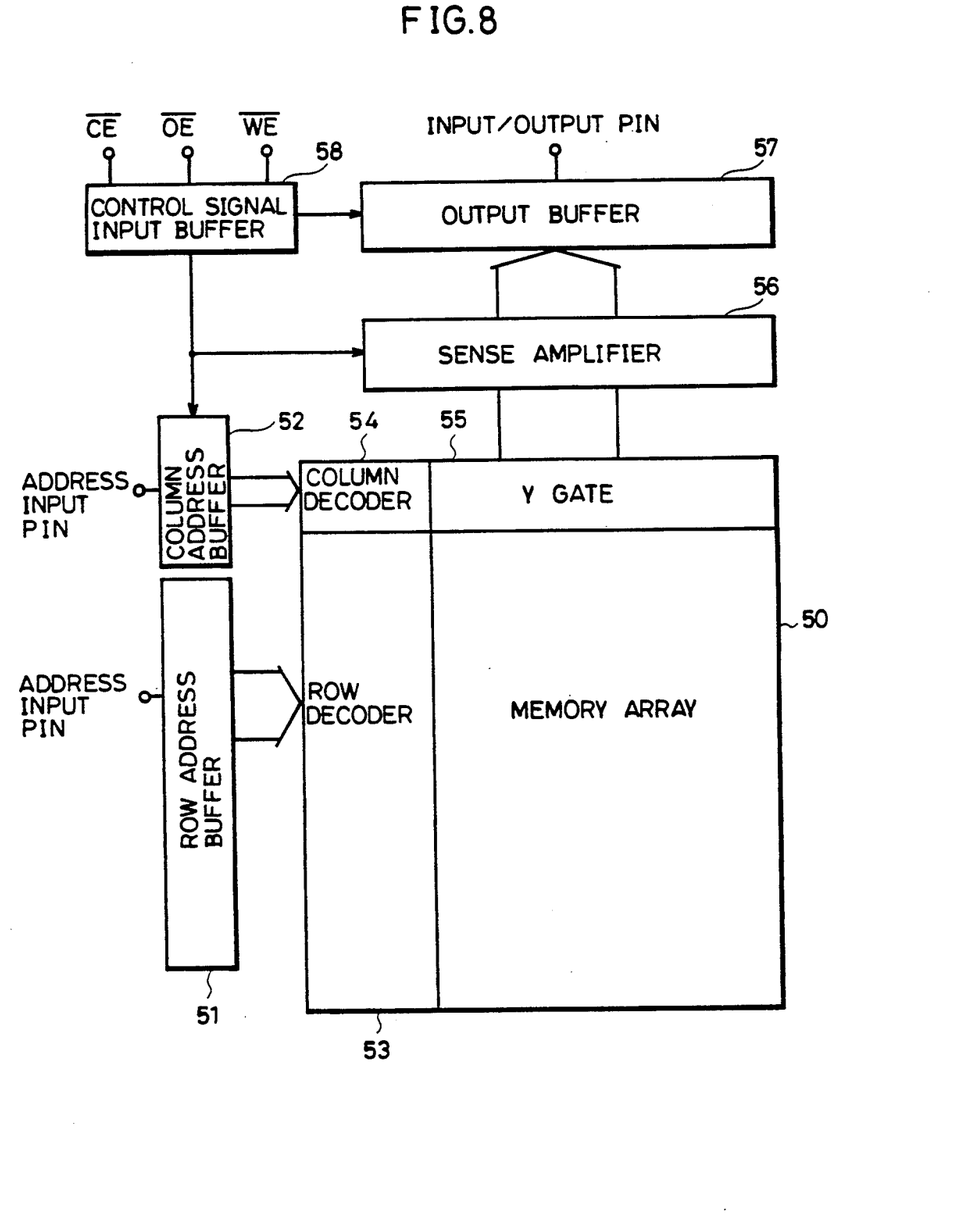
FIG. 8 is a block diagram showing the structure of a conventional EEPROM.

FIG. 8 is a block diagram showing the structure of a conventional EEPROM.

Referring to FIG. 8, the EEPROM comprises a memory array 50 including memory cells, a row address buffer 51 for receiving a row address signal from the exterior, a column address buffer 52 for receiving a column address signal, a row decoder 53 and a column decoder 54 for decoding the address signals to supply voltage to a word line and a bit line specified by a specific memory cell, a sense amplifier 56 for reading a signal stored in the memory cell specified by the two decoders 53 and 54 through a Y gate 55, an output buffer 57 for outputting the read signal and a control signal input buffer 58 for receiving control signals from the exterior and supplying the same to the respective parts.

The sense amplifier 56 is adapted to detect and amplify the signal stored in the memory cell to supply the same to the output buffer 57.

Figure 9:
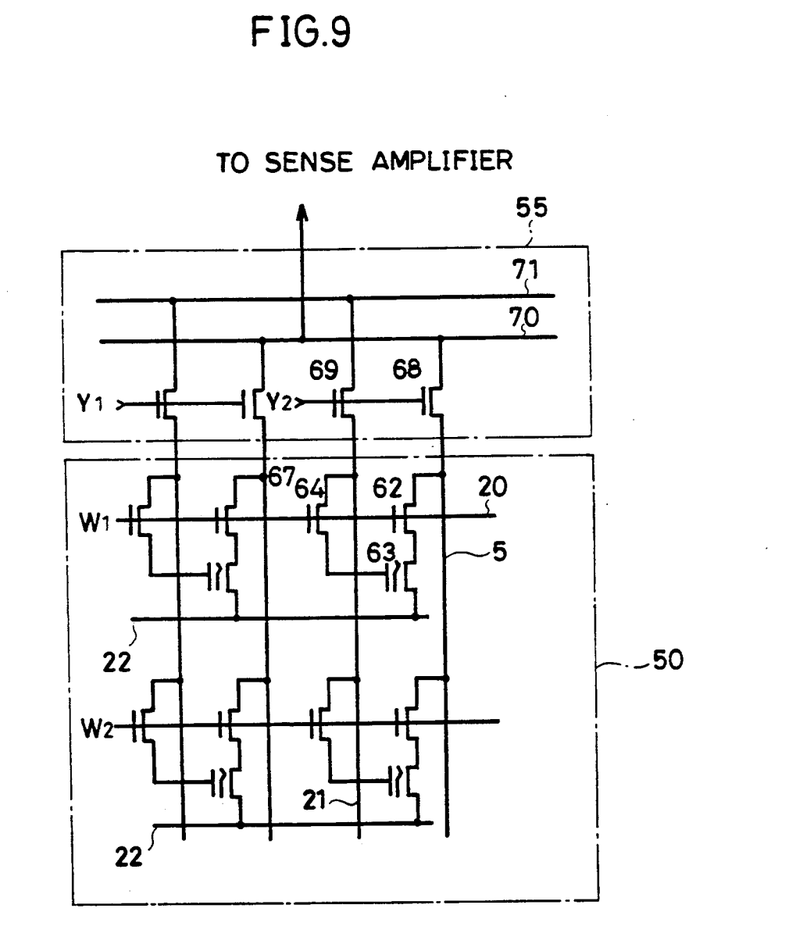
FIG. 9 is a circuit diagram showing the internal structure of a memory array and a Y gate shown in FIG. 8.

FIG. 9 is a circuit diagram concretely showing the structure of the memory array 50 and the Y gate 55 shown in FIG. 8.

Referring to FIG. 9, the Y gate 55 includes a transistor 68 which is connected between an I/0 line 70 and a bit line 5 and another transistor 69 which is connected between a CG line 71 and a control gate line 21. A Y gate signal Y2 is supplied to the gates of the transistors 68 and 69. Transistors for receiving a Y gate signal Y1 are connected similarly to the above.

The memory array 50 is illustrated with 4-bit memory cells. For example, a memory cell includes a memory transistor 63 having a floating gate and a select transistor 62 whose gate is connected to a word line 20 for supplying a signal stored in the memory transistor 63 to the bit line 5. Another select transistor 64 is so connected that its gate is connected to the word line 20 for supplying a signal from the control gate line 21 to the gate of the memory transistor 63. The sources of the memory transistors 63 of respective such bits, belonging to the same byte, are connected to a common source line 22.

Operation of this EEPROM is now described.

The memory transistor 63 stores a binary signal, depending on whether or not its floating gate stores electrons. If the floating gate stores electrons, the threshold voltage of the memory transistor 63 is increased to turn off the same in read operation. It is assumed that information "1" is stored in this state. When the floating gate stores no electrons, on the other hand, the threshold voltage of the transistor 63 goes negative to turn on the same in read operation. It is assumed that information "0" is stored in this state.

The sense amplifier 56 supplies voltage for reading to the bit line 5 through the transistor 68. This voltage is further supplied to the memory transistor 63 through the transistor 62. Thus, the sense amplifier 56 detects whether or not current flows to the memory transistor 63, thereby to read the signal stored in the memory transistor 63.

Figure 10:
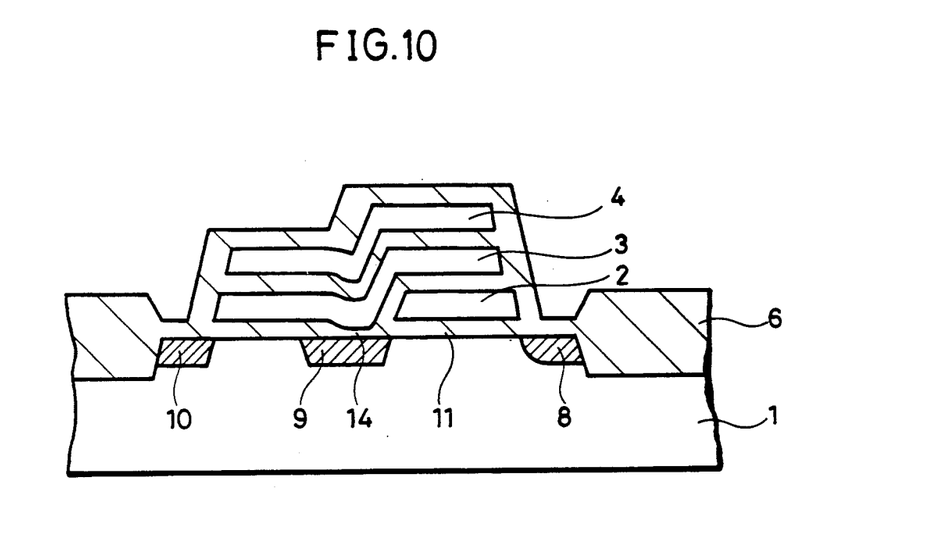
FIG. 10 is a sectional view showing the structure of the conventional EEPROM.

FIG. 10 is a sectional view showing the structure around a memory transistor of the conventional EEPROM.

This structure is disclosed in Japanese Patent Laying-Open Gazette No. 80779/1982. Brief description is now made on the structure and the operation thereof, in correspondence to FIG. 9.

N-type impurity regions 8, 9 and 10 are formed with prescribed spaces on an active region defined by an isolation oxide film 6 on the major surface of a semiconductor substrate 1 of P-type silicon. A gate 2 of the select transistor 62 is formed on a region between the impurity regions 8 and 9, through an insulating film 11. A floating gate 3 of the memory transistor 63 is formed in the configuration shown in FIG. 10 in the impurity region 9 through a thin insulating film 14 for serving as a tunnel oxide film. A control gate 4 of the memory transistor 63 is formed on the floating gate 3 in a configuration similar to that of the floating gate 3. The select gate 2, the floating gate 3 and the control gate 4 are entirely covered with an insulating film. The impurity region 8 for serving as a drain region of the select transistor 62 is connected to the bit line 5, while the impurity region 10 for serving as a source region of the memory transistor 63 is connected to the source line 22.

In erase operation of injecting electrons into the floating gate 3, the word line 20 is selected to apply high voltage to the select gate 2, thereby to select the cell. The bit line 5 and the source line 22 are zeroized in voltage while high voltage is applied to the control gate 4, whereby electrons are injected into the floating gate 3 from the drain region 9 through the tunnel oxide film 14.

In write operation of extracting electrons from the floating gate 3, the word line 20 is selected to apply high voltage to the select gate 2, thereby to select the cell. Then the source line 22 is floated and the voltage at the control gate 4 is zeroized to apply high voltage to the bit line 5, whereby the electrons are extracted from the floating gate 3 to the drain region 9 through the tunnel oxide film 14.

Tunneling operation is described in detail in, for example, "On tunneling in metal-oxide silicon structures" by Z. A. Weinberg in J. Appl. Phys. 53(7), pp. 5052–5056, 1982.

In read operation, the word line 20 is selected to apply prescribed voltage to the select gate 2, thereby to select the cell. The voltage at the source line 22 is zeroized and positive voltage is supplied to the bit line 5, thereby to apply bias voltage for reading to the control gate 4. Drain current, which is varied with presence/absence of charge storage in the floating gate 3, is detected thereby to read the stored information "1" or "0".

Table 1 shows voltage levels of the respective parts of the EEPROM in respective operating modes, with application of program voltage of 18 V.

TABLE 1

| Node | Mode | | |
|---|---|---|---|
| | Write | Erase | Read |
| Word Line (Select Gate) | 18 V | 18 V | 5 V |
| Bit Line (Aluminum Wire) | 18 V | 0 V | 1 V |
| Control Gate | 0 V | 18 V | 2 V |
| Source Line | Floating State | 0 V | 0 V |

In the aforementioned conventional non-volatile semiconductor memory device, inconvenience is caused in an operating mode for writing.

When electrons are gradually extracted from the floating gate 3 in write operation, the threshold voltage of the memory transistor 63 formed by the drain region 9 and the source region 10 goes negative at a certain point of time, to turn on the same. Thus, the drain region 9 and the source region 10 enter conducting states, while the source line 22, to which the source region 10 is connected, is in a floating state Assuming that the voltage of 18 V is applied to the drain region 9 as hereinabove described, the potential at the source region 10, i.e., that at the source line 22 is increased to 7 to 8 V.

Within the memory cells of the same byte having the source line 22 in common, which is shown in FIG. 9, note a memory cell which is not selected in the write operation. The aforementioned voltage of 7 to 8 V is also applied to the source region of the memory transistor of the non-selected cell through its tunnel oxide film. When such voltage application of 7 to 8 V is only once, electrons in the floating gate of the non-selected memory transistor are not entirely extracted to its source region. However, if such voltage is applied about $10^4$ to $10^5$ times, a considerable amount of the electrons may be extracted from the floating gate to the source region. Even if the electrons are not entirely extracted, the margin of the storage capacity of the memory cell is reduced by partial extraction of the electrons, to lose allowance for noise. Thus, possibility of causing a read error is increased.

In order to manufacture the EEPROM shown in FIG. 10, further, it has been inevitably required to widen the drain region 9 beyond necessity, to correctly position the tunnel oxide film 14. In other words, the impurity for forming the drain region 9 is injected through a mask of a resist film which is formed by exposure technique, and hence misalignment of such a mask must be taken into consideration. Thus, the conventional manufacturing method is rather disadvantageous for refinement of EEPROM.

SUMMARY OF THE INVENTION

An object of the present invention is to provide a highly reliable non-volatile semiconductor memory device.

Another object of the present invention is to provide a non-volatile semiconductor memory device which exerts no influence by write operation of a memory cell to another memory cell.

Still another object of the present invention is to provide a non-volatile semiconductor memory device which exerts no influence by write operation of a memory cell in one byte to other memory cells belonging to the same byte.

A further object of the present invention is to provide a method of manufacturing a non-volatile semiconductor memory device, which can accurately form impurity regions for defining parts of transistors.

A further object of the present invention is to provide a method of manufacturing a non-volatile semiconductor memory device which can form impurity regions for defining parts of transistors on the basis of gate electrodes in a self-alignment manner.

A further object of the present invention is to electrically shield a floating gate against a source region in a memory cell having self-aligned structure.

In order to attain the aforementioned objects, the non-volatile semiconductor memory device according to the present invention comprises a semiconductor substrate of a first conductivity type having a major surface and a plurality of memory transistors which are commonly formed on the major surface of the semiconductor substrate and connected to a common source line. Each of the plurality of memory transistors comprises first, second and third impurity regions, a first conductor, a second conductor and a third conductor. The third impurity region is connected to the common source line. The first, second and third impurity regions, which are of a second conductivity type being reverse to the first conductivity type, are provided on the major surface of the semiconductor substrate with prescribed spaces, to define first and second channel regions in portions of the major surface of the semiconductor substrate held between the same. The first conductor is formed on the second channel region through an insulating film. The second conductor is formed on the first channel region through an insulating film as well as on the first conductor through an insulating film, to be capable of storing charges. The third conductor is formed on the second conductor through an insulating film, to be electrically connected with the first conductor. In the non-volatile semiconductor memory device having the above structure, the first conductor for serving as a control gate is formed between the second conductor for serving as a floating gate and the third impurity region which is connected to a source line, whereby no influence is exerted to the second conductor by a potential applied to the third impurity region through the source line.

In order to attain the aforementioned objects, the inventive method of manufacturing a non-volatile semiconductor memory device comprises first to 15th steps. The first step is adapted to prepare a semiconductor substrate of a first conductivity type having a major surface. The second step is adapted to form a first insulating film on the major surface of the semiconductor substrate. The third step is adapted to form first and second conductors of prescribed configurations on the first insulating film with a prescribed space. The fourth step is adapted to form a second insulating film on the first insulating film to cover the first and second conductors. The fifth step is adapted to form a flattening film on the second insulating film to flatten the surface thereof. The sixth step is adapted to etch the flattening film to expose parts of the second insulating film located on the first and second conductors. The seventh step is adapted to anisotropically remove the exposed parts of the second insulating film and to remove parts of the first insulating film located under the removed parts of the second insulating film, thereby to partially expose the semiconductor substrate. The eighth step is adapted to employ residual parts of the first and second insulating films, the first and second conductors and the flattening film as masks for implanting an impurity of a second conductivity type, which is reverse to the first conductivity type, into the exposed parts of the semiconductor substrate, thereby to form first, second, third and fourth impurity regions on the major surface of the semiconductor substrate. The ninth step is adapted to leave only the first and second conductors and the parts of the first insulating film located under the same. The tenth step is adapted to form a third insulating film on the major surface of the semiconductor substrate to cover the first and second conductors. The 11th step is adapted to form a third conductor over a region of the third insulating film held between the first and second conductors and above the first and second conductors. The 12th step is adapted to form a fourth insulating film on the third conductor. The 13th step is adapted to form a fourth conductor on the fourth insulating film. The 14th step is adapted to employ the first, second, third and fourth conductors as masks to implant an impurity of the second conductivity type, which is reverse to the first conductivity type, into the major surface of the semiconductor substrate through the third insulating film formed on the major surface of the semiconductor substrate, thereby to form fifth and sixth impurity regions which are integrated with the fist and fourth impurity regions on the semiconductor substrate. In the method of manufacturing a non-volatile semiconductor memory device having the aforementioned structure, the impurity is implanted into the semiconductor substrate through masks of the first and second conductors for serving as gate electrodes, thereby to form the impurity regions on the semiconductor substrate in a self-alignment manner.

U.S. Pat. No. 4,417,264 shows a non-volatile semiconductor memory device having self-aligned structure in FIG. 2 thereof, in which a source region 16 and a control gate 32 are aligned with each other. A floating gate 40 provided above the control gate 32 is partially shielded against the source region 16. In practice, however, the floating gate 40 is apt to be formed beyond the control gate 32, to face the source region 16. Thus, it is ineffective to shield the floating gate against the source region by the control gate.

Accordingly, a further object of the present invention is to improve the manner of shielding a floating gate against a source region by a control gate in a self-aligned non-volatile semiconductor memory device.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
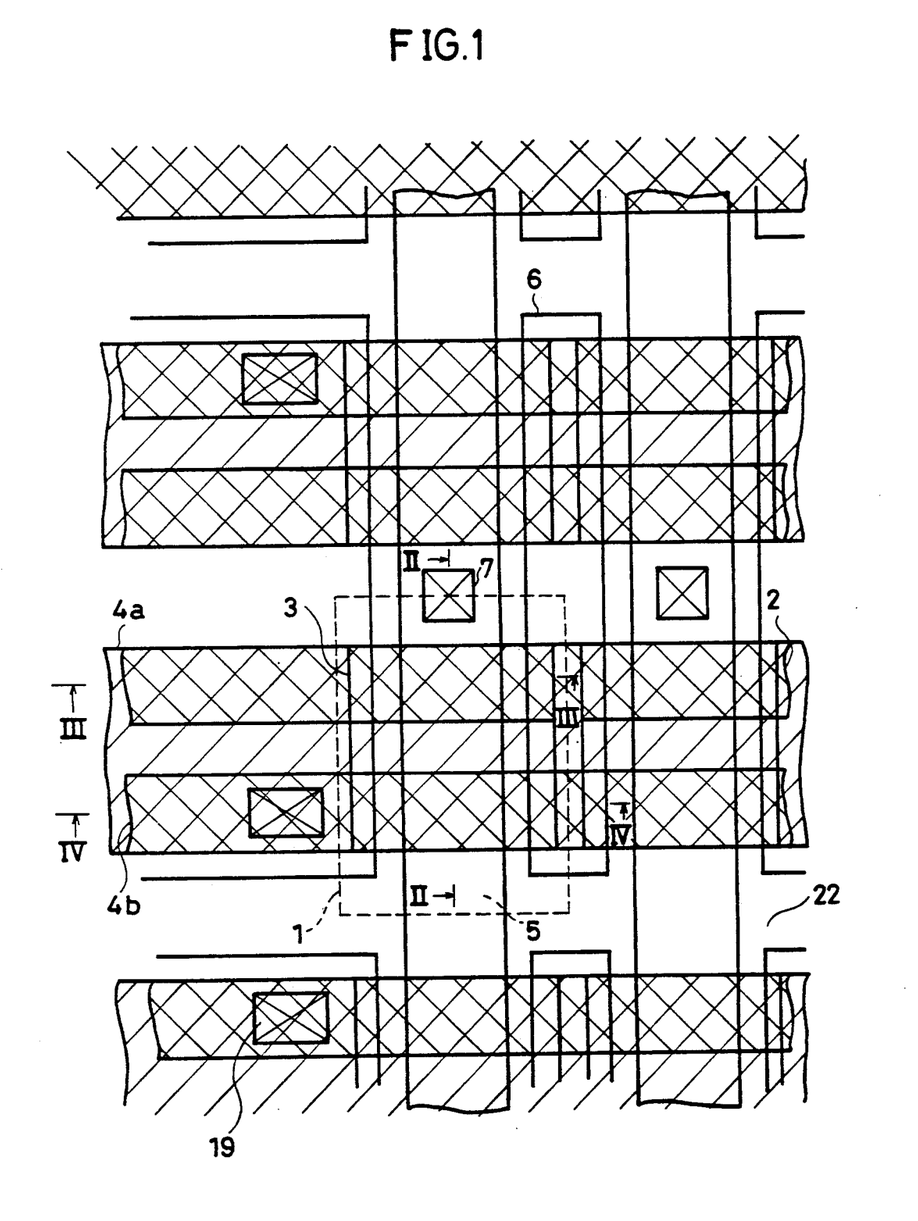
FIG. 1 is a plan view showing a non-volatile semiconductor memory device according to an embodiment of the present invention.
Figure 2:
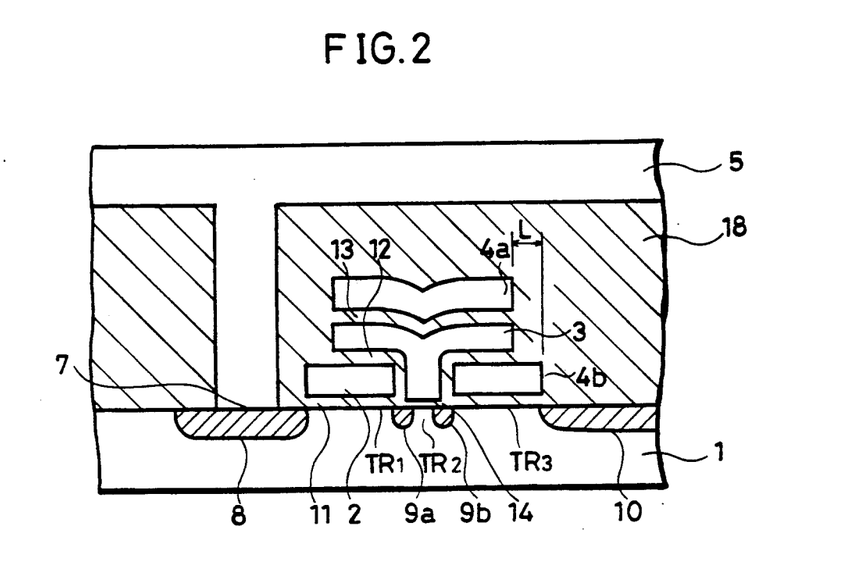
FIG. 2 is a sectional view taken along the line II—II in FIG. 1.
Figure 3:
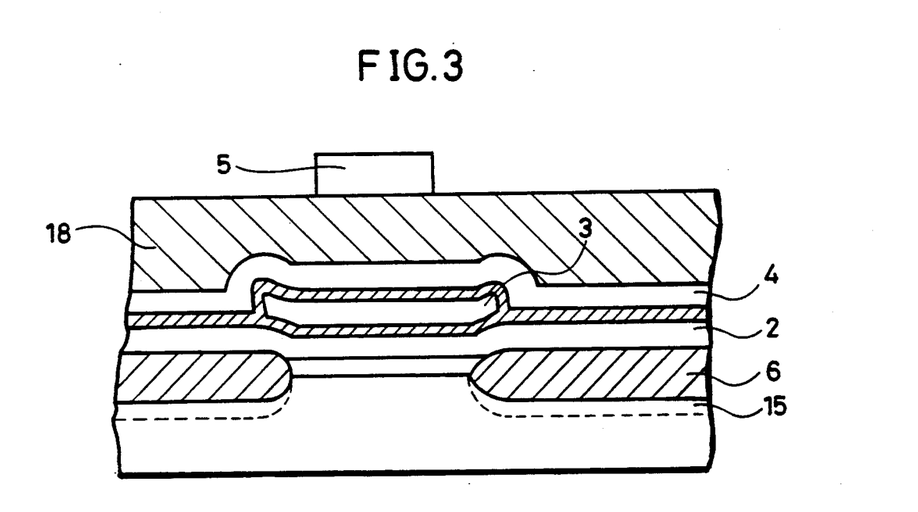
FIG. 3 is a sectional view taken along the line III—III in FIG. 3.
Figure 4:
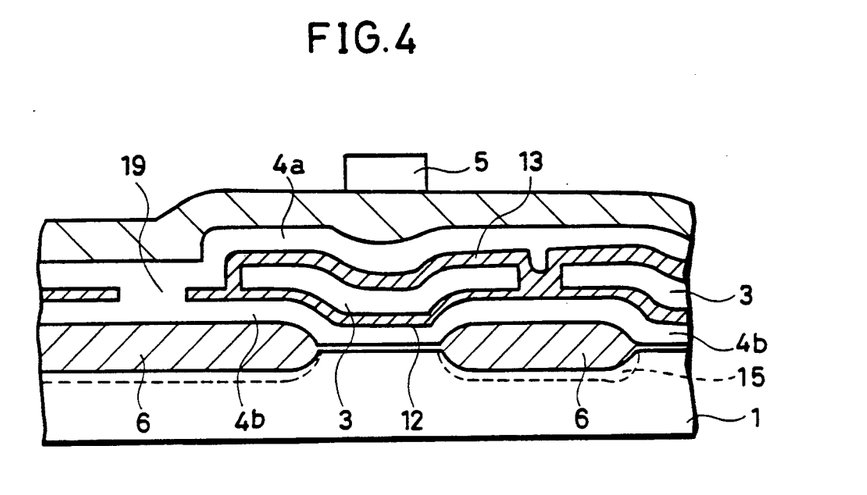
FIG. 4 is a sectional view taken along the line IV—IV in FIG. 1.

FIG. 1 is a plan view showing a non-volatile semiconductor memory device according to an embodiment of the present invention, FIG. 2 is a sectional view taken along the line II—II in FIG. 2, FIG. 3 is a sectional view taken along the line III—III in FIG. 1, and FIG. 4 is a sectional view taken along the line IV—IV in FIG. 1.

With reference to FIGS. 1 to 4, description is now made on the structure of this embodiment.

As shown in FIG. 1, a bit line 5 is vertically provided to be connected to a 1-bit memory cell 1, which is shown by broken lines, through a contact hole 7. A first control gate 4a and a second control gate 4b are provided perpendicularly to the bit line 5, while a select gate 2 and a floating gate 3 are provided in the same direction. N-type impurity regions 8, 9a, 9b and 10 are provided on a major surface of a P-type semiconductor substrate 1 with prescribed spaces. The select gate 2 is formed on a region between the impurity regions 8 and 9a through an insulating film 11. A transistor TR1 is defined by the select gate 2 and the impurity regions 8 and 9a. The second control gate 4b is formed on a region between the impurity regions 9b and 10 through an insulating film, to define a transistor TR3. The floating gate 3 is formed on a region between the impurity regions 9a and 9b through a tunnel oxide film 14 to cover the select gate 2 and the second control gate 4b, thereby to define a transistor TR2. As shown in FIG. 2, both end portions of the floating gate 3 are inwardly separated from upper end portions of the select gate 2 and the second control gate 4b by a distance L, in order to further improve the effect of electrically shielding the floating gate 3 against the impurity region 10. The first control gate 4a is formed on the floating gate 3 through an insulating film 13, to be electrically connected with the second control gate 4b through a contact hole 19. An interlayer isolation film 18 is formed on the major surface of the semiconductor substrate 1 to cover the entire memory transistor thus defined. The bit line 5 is formed on the interlayer isolation film 18, to be connected to the impurity region 8 through the contact hole 7 defined in the interlayer isolation film 18. Portions for serving as channel regions of the transistors TR1, TR2 and TR3 are ensured by an isolation oxide film 6, which is formed on the major surface of the semiconductor substrate 1. An impurity region 15 of high concentration is formed under the isolation oxide film 6 for preventing inversion. Although the drain region 9a and the source region 9b of the transistor TR2 are separated from each other with a prescribed space in this embodiment, such regions may planarly overlap with each other. In this case, the overlapping part serves as the channel region of the transistor TR2. The source region 10 of the transistor TR3 is connected to a common source line, similarly to the conventional case.

With reference to FIGS. 1 to 4, operation of this embodiment is now described.

In erase operation of injecting electrons into the floating gate 3, the voltage at the select gate 2 is increased to turn on the transistor TR1. The bit line 5 is set at 0 V, and the first and second control gates 4a and 4b are set at program voltage. The source region 10 of the read transistor TR3 is set at 0 V. Thus, electrons are injected into the floating gate 3 through the tunnel oxide film 14.

In write operation of extracting the electrons from the floating gate 3, the select gate 2 is set at high voltage, thereby to turn on the select transistor TR1. The bit line 5 is set at program voltage, and the first and second control gates 4a and 4b are set at 0 V. At this time, the source region 10 is floated Thus, high voltage is applied to the tunnel oxide film 14 to provide tunnel current, whereby the electrons are extracted from the floating gate 3 to the impurity region 9a.

Consider another memory transistor which is connected to the common source line but not selected in the write operation. While the potential at its source region 10 is considerably increased, its floating gate 3 is not in proximity to the source region 10 as shown in FIG. 2, but the second control gate 4b is interposed therebetween. Thus, no electrons are extracted from the floating gate 3 of the non-selected cell to the source region 10.

In read operation, prescribed voltage is applied to the select gate 2, thereby to turn on the select transistor TR1. A prescribed potential is applied to the bit line 5, as well as to the first and second control gates 4a and 4b. At this time, an inversion layer is defined under the second control gate 4b. The source region 10 is set at 0 V, and a determination is made in this state as to whether or not the floating gate transistor TR2 is in an ON state, i.e., whether or not drain current is generated to flow from the impurity region 8 to the impurity region 10. Namely, an information holding state of the floating gate 3 is judged by presence/absence of the drain current.

Figure 5:
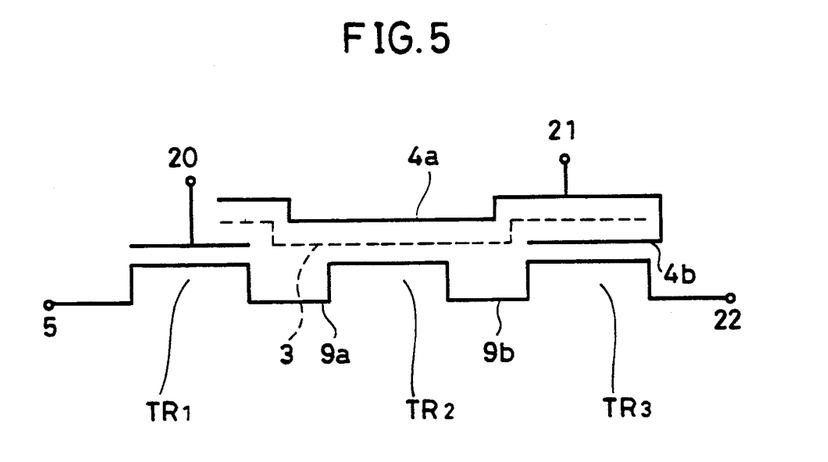
FIG. 5 is an equivalent circuit diagram of a 1-bit memory cell according to the embodiment of the present invention.
Figure 6:
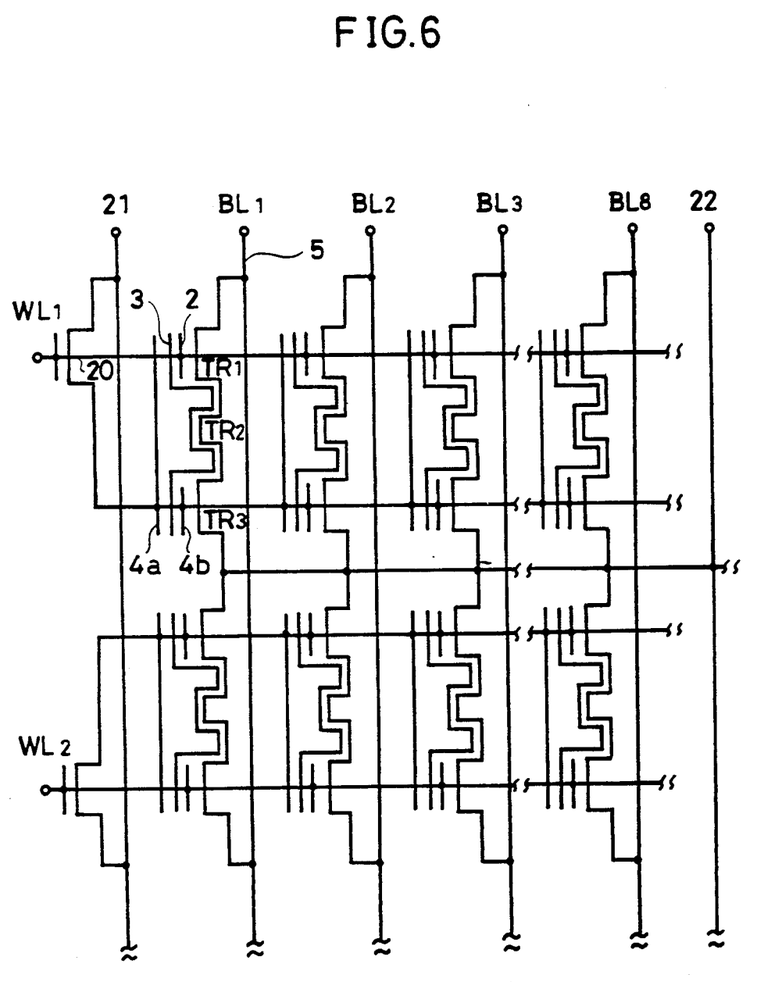
FIG. 6 is an equivalent circuit diagram of an array of such memory cells.

FIG. 5 is an equivalent circuit diagram of a portion corresponding to one bit of an EEPROM according to the embodiment of the present invention, and FIG. 6 is an equivalent circuit diagram of an array of such memory cells.

Referring to FIGS. 5 and 6, a select transistor TR1, a floating gate transistor TR2 and a read transistor TR3 are connected in series between a bit line 5 and a source line 22. The gate of the transistor TR1 is connected to a word line 20, and control gates 4a and 4b are interconnected with each other to be connected to a control gate line 21. Referring to FIG. 6, source regions of transistors TR3 included in a byte belonging to a word line WL1 are interconnected with those of transistors TR3 of memory cell transistors included in another byte belonging to another word line WL2, to be connected to the common source line 22.

Respective memory transistors thus connected to the common source line are independent of each other, to mutually exert no influence in write operation.

FIGS. 7A to 7K are schematic sectional views showing steps of manufacturing a non-volatile semiconductor memory device according to the embodiment of the present invention as shown above.

With reference to FIGS. 7A to 7K, description is now made on the inventive manufacturing method.

Figure 7A:
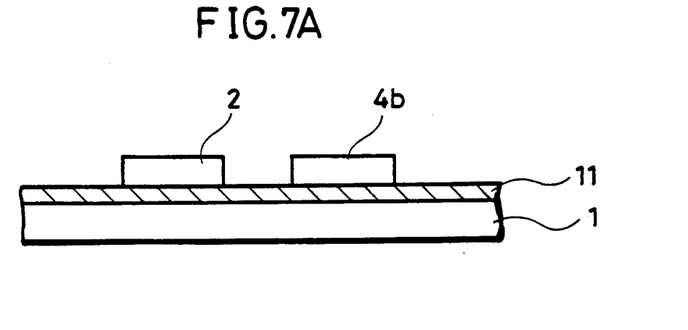
FIGS. 7A to 7K are schematic sectional views showing steps of manufacturing the non-volatile semiconductor memory device according to the embodiment of the present invention.

An isolation oxide film for isolating elements and a channel stopper (not shown) are formed on a major surface of a P-type semiconductor substrate 1, to ensure an active region. A first gate insulating film 11 is formed on the major surface of the semiconductor substrate 1, and a conductor layer doped with an N-type impurity is formed on the same to be worked into a prescribed configuration through photolithography, thereby to provide a select gate 2 and a second control gate 4b (FIG. 7A).

Figure 7B:
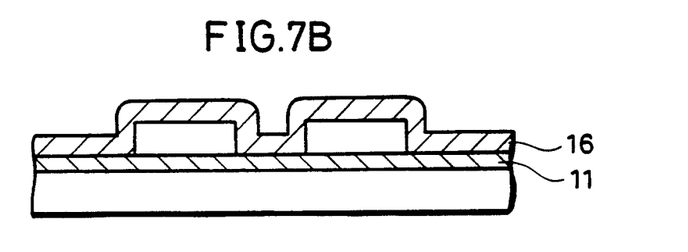
Figure 7C:
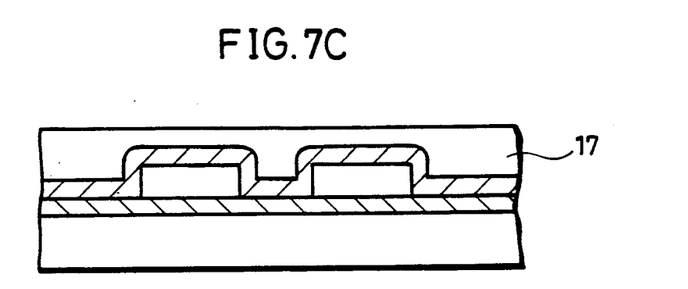

An oxide film 16 of prescribed thickness is formed on the insulating film 11 through CVD, to cover the select gate 2 and the second control gate 4b (FIG. 7B).

Figure 7D:
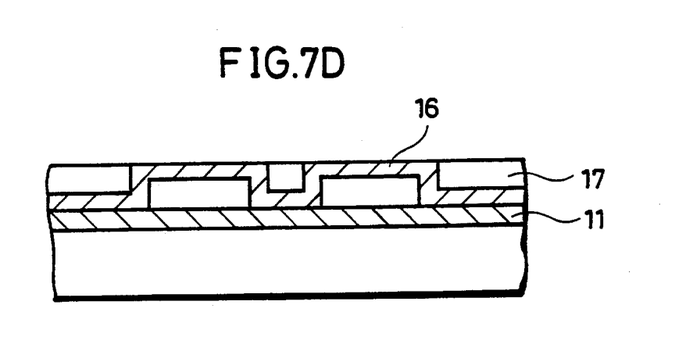
Figure 7E:
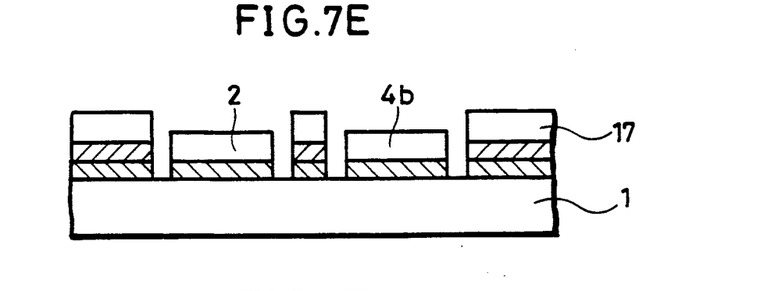

Then, a resist film 17 is applied over the entire surface to flatten the upper surface of the oxide film 16 (FIG. 7C), and etched back to expose the uppermost surface of the oxide film 16 (FIG. 7D).

Figure 7F:
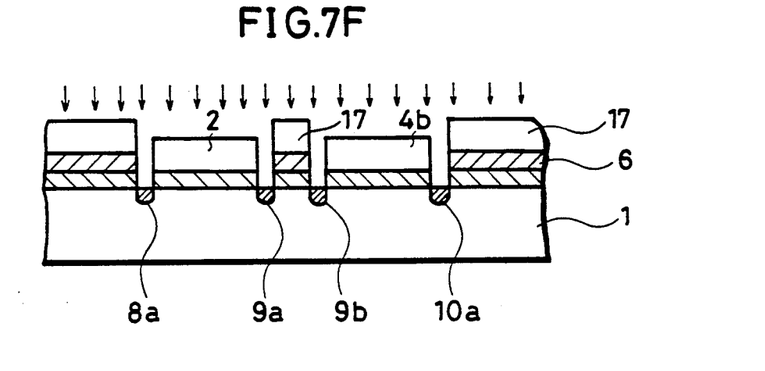
Figure 7G:
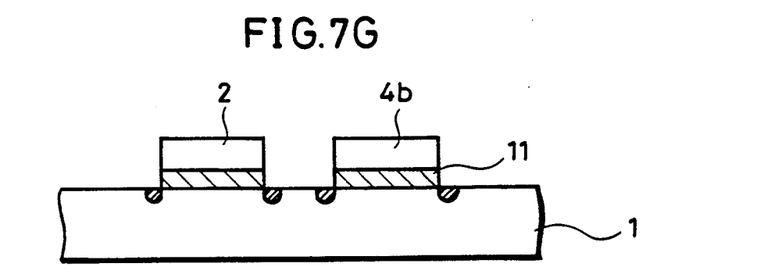

Then, only exposed parts of the oxide film 16 and the first gate insulating film 11 under the same are selectively removed (FIG. 7E) and an N-type impurity is ion-implanted in this state, thereby to define $N^+$-type impurity layers 8a, 9a, 9b and 10a on the exposed major surface parts of the semiconductor substrate 1 (FIG. 7F).

Figure 7H:
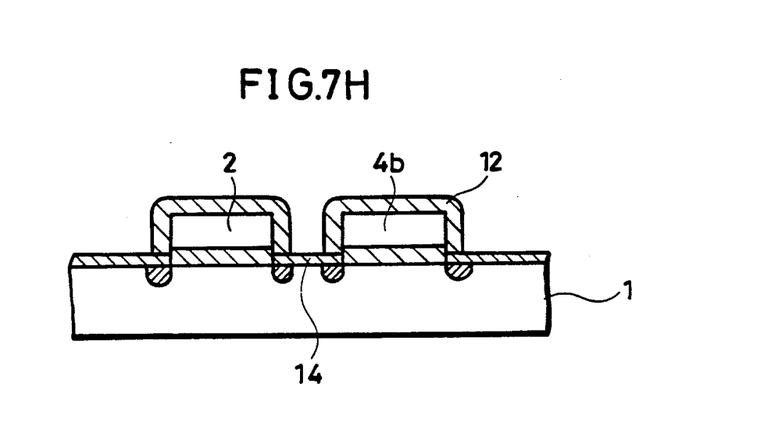

Residual parts of the resist film 17 and the oxide film 16 are removed (FIG. 7G), and an interlayer isolation film 12 is formed to cover the select gate 2 and the second control gate 4b, while a thin insulating film 14 is formed on the exposed major surface of the semiconductor substrate 1 to serve as a tunnel oxide film (FIG. 7H).

Figure 7I:
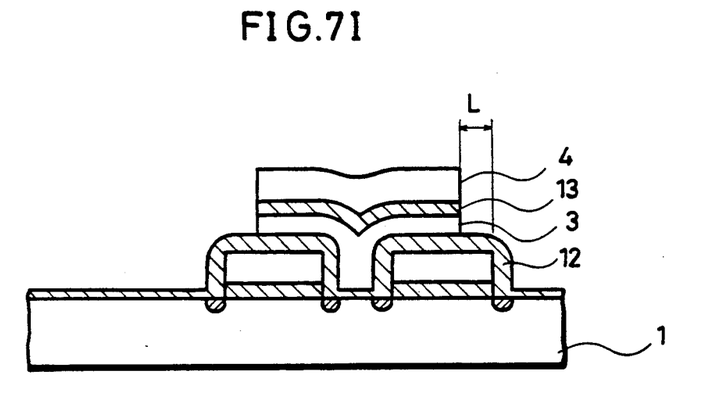

Then, a conductor layer, an oxide film layer and another conductor layer are sequentially formed on upper surfaces of these insulating films and worked through photolithography, thereby to define a second conductor layer 3 for serving as a control gate, an interlayer isolation film 13 located on the said control gate and a third conductor layer 4 for serving as a first control gate. At this time, the second conductor layer 3 is so patterned that its end portion is inwardly separated from an upper end portion of the control gate 4b by a distance L. Such patterning is preferable in order to improve an effect of electrically shielding the second conductor layer 3 against an impurity region 10 which is formed in a later step (FIG. 7I).

Figure 7J:
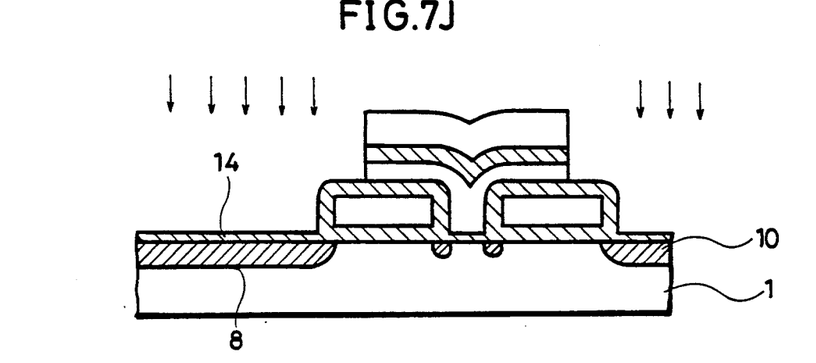

An N-type impurity is ion-implanted into the major surface of the semiconductor substrate 1 through the insulating film 14, thereby to form an impurity region 8 for serving as a drain region of the select transistor TR1 and an impurity region 10 for serving as a source region of the read transistor TR3 (FIG. 7J).

Figure 7K:
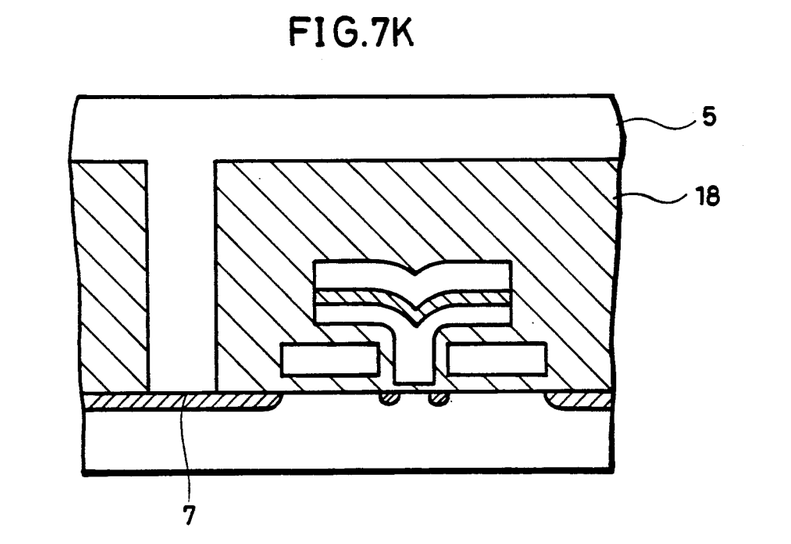

Thereafter a flattening insulating film 18 is formed to cover the entire surface of such a memory transistor through an ordinary process, and a contact hole 7 is defined in this insulating film 18 to expose a part of the impurity region 8. An aluminum layer is formed on the insulating film 18 including the interior of the contact hole 7 and worked into a prescribed configuration through photolithography to define a bit line, thereby to complete the inventive semiconductor memory device (FIG. 7K).

Although the above embodiment is applied to an EEPROM, the present invention is also applicable to a non-volatile memory device erasable by ultraviolet rays or the like (EPROM), as a matter of course.

While the conductivity type of the EEPROM is specified in the above embodiment, the present invention is also applicable to an EEPROM of a reverse conductivity type.

Although the select transistor TR1 is provided in proximity to the memory transistor, the same may be separated from the memory transistor, to attain a similar effect.

In the inventive semiconductor memory device, as hereinabove described, the control gate is interposed between the floating gate and the source region which is connected to the source line and the floating gate extends only partially above the control gate, whereby reliability of the EEPROM is improved since no influence is exerted to a non-selected memory cell by increase in potential of the source line caused by write operation of a selected memory cell. Further, since the impurity regions are formed in side portions of the channel regions provided under the floating gate, channel resistance is reduced to increase read current.

According to the inventive method of manufacturing a semiconductor memory device, as hereinabove described, the gate electrodes are formed to serve as masks for implanting the impurity, thereby to accurately form the impurity regions in a self-alignment manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a non-volatile semiconductor memory device, comprising the steps of:

preparing a semiconductor substrate of a first conductivity type having a major surface;

forming a first insulating film on said major surface of said semiconductor substrate;

forming first and second conductors of prescribed configurations on said first insulating film with a prescribed space;

forming a second insulating film on said first insulating film to cover said first and second conductors;

forming a flattening film on said second insulating film to flatten the surface thereof;

etching said flattening film to expose parts of said second insulating film covering said first and second conductors;

anisotropically removing exposed said parts of said second insulating film and further removing parts of said first insulating film located under said removed parts of said second insulating film thereby to expose parts of said semiconductor substrate;

employing residual parts of said first and second insulating films, said first and second conductors and a resist film as masks to implant an impurity of a second conductivity type, being reverse to said first conductivity type, into said exposed parts of said semiconductor substrate thereby to form first, second, third and fourth impurity regions on said major surface of said semiconductor substrate;

removing residual parts of said flattening film and further removing parts of said first insulating film and said second insulating film located under said residual parts of said flattening film;

forming a third insulating film on said major surface of said semiconductor substrate to cover said first and second conductors;

forming a third conductor over a region of said third insulating film held between said first and second conductors and above said first and second conductors;

forming a fourth insulating film on said third conductor;

forming a fourth conductor on said fourth insulating film; and employing said first, second, third and fourth conductors as masks to implant an impurity of said second conductivity type, being reverse to said first conductivity type, into said major surface of said semiconductor substrate through said insulating film formed on said major surface of said semiconductor substrate, thereby to form fifth and sixth impurity regions to be integrated with said first and fourth impurity regions on said semiconductor substrate.

2. A method of manufacturing a non-volatile semiconductor memory device in accordance with claim 1, further comprising the steps of:

forming an interlayer isolation film on said major surface of said semiconductor substrate to cover said first, second, third and fourth conductors, defining an opening in said interlayer isolation film for exposing a part of said fifth impurity region, and forming a fifth conductor on said interlayer isolation film including the interior of said opening.

3. A method of manufacturing a non-volatile semiconductor memory device in accordance with claim 1, wherein
said second insulating film is formed by a CVD process.

4. A method of manufacturing a non-volatile semiconductor memory device in accordance with claim 1, wherein
said flattening film includes a resist film.

* * * * *